(12) United States Patent
Erbkamm et al.

(10) Patent No.: US 7,776,192 B2
(45) Date of Patent: Aug. 17, 2010

(54) ELONGATE VACUUM SYSTEM FOR COATING ONE OR BOTH SIDES OF A FLAT SUBSTRATE

(75) Inventors: Wolfgang Erbkamm, Dresden (DE); Dietmar Schulze, Dresden (DE); Jens Melcher, Dresden (DE); Olaf Gawer, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 832 days.

(21) Appl. No.: 10/578,049

(22) PCT Filed: Nov. 4, 2004

(86) PCT No.: PCT/DE2004/002466

§ 371 (c)(1),
(2), (4) Date: Mar. 7, 2007

(87) PCT Pub. No.: WO2005/045092

PCT Pub. Date: May 19, 2005

(65) Prior Publication Data

US 2008/0283393 A1    Nov. 20, 2008

(30) Foreign Application Priority Data

Nov. 4, 2003    (DE)    ................................. 103 52 143

(51) Int. Cl.
C23C 14/35    (2006.01)
C23C 16/00    (2006.01)

(52) U.S. Cl. ........................ 204/298.07; 204/298.25; 204/298.23; 204/298.33; 118/718; 118/719; 414/217; 414/221

(58) Field of Classification Search ............ 204/298.07, 204/298.23, 298.25, 298.33; 118/718, 719; 414/217, 221

See application file for complete search history.

(56) References Cited

U.S. PATENT DOCUMENTS 4,975,168 A    12/1990    Ohno ..................... 204/192.13

(Continued)

FOREIGN PATENT DOCUMENTS

DE    19733940    2/1999
EP    0772223    5/1997

(Continued)

Primary Examiner—Rodney G McDonald
(74) Attorney, Agent, or Firm—Heslin Rothenberg Farley & Mesiti P.C.

(57) ABSTRACT

An elongate vacuum system for coating one or both sides of a flat substrate which can be displaced by the system, comprises at least one magnetron provided with a magnetron surrounding area and is subdivided into successive compartments in the direction of transportation of the substrate by separating walls having closeable suction openings. The compartments can be evacuated either directly by a vacuum connection provided on the compartment or indirectly via a suction opening in the separating wall. At least one compartment comprises an upper partial compartment which is arranged above the substrate. The partial compartment comprises a closeable upper opening in at least one of the outer walls thereof. The aim is to produce an elongate coating system which is flexible to use according to the requirements of various one and two-sided coating processes and ensures a stable, differential and process-optimized sputter atmosphere. At least in one of the upper partial compartments, horizontal and/or vertical elements can be mounted in order to subdivide the upper partial compartment into several sections.

16 Claims, 2 Drawing Sheets

Figure 1:
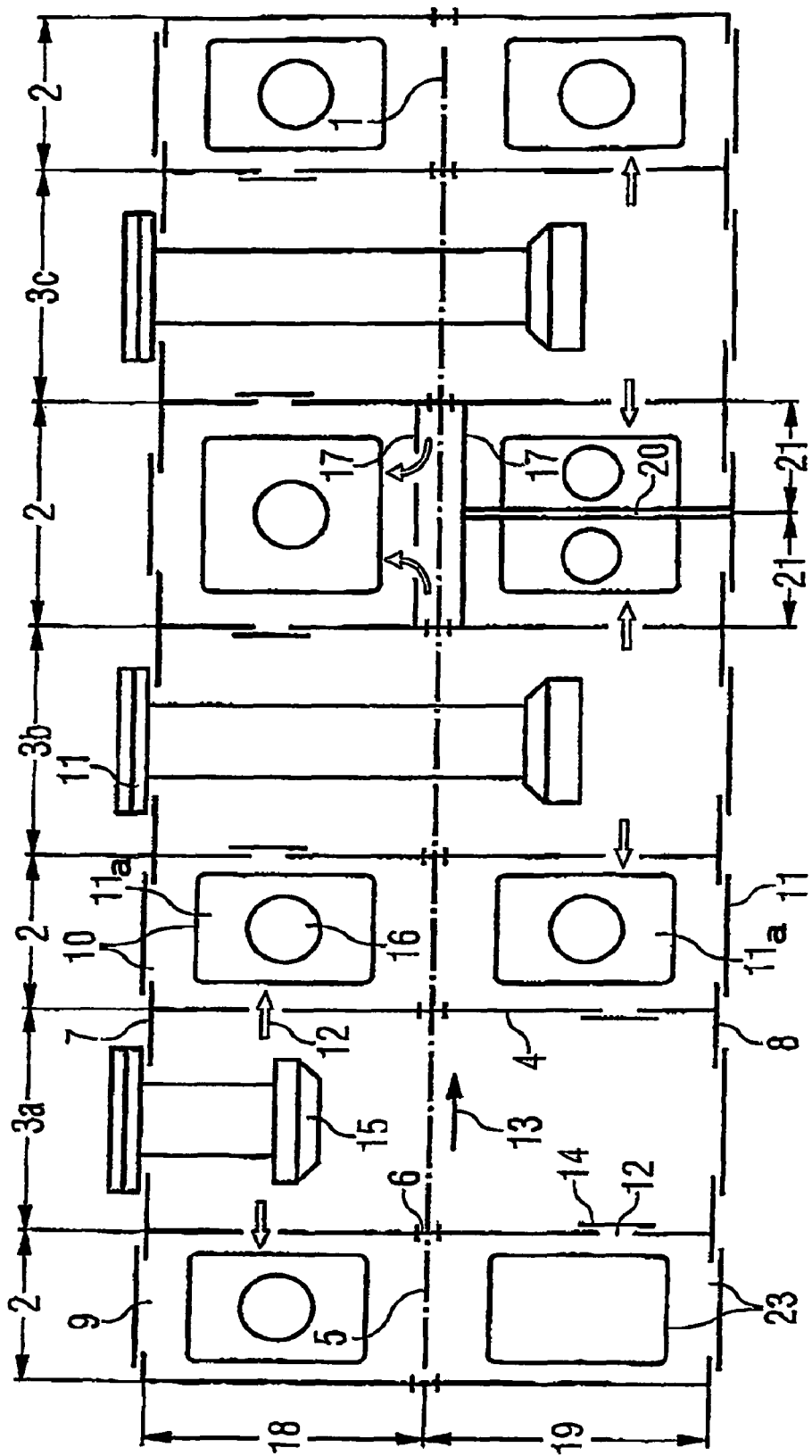

U.S. PATENT DOCUMENTS 5,489,369 A * 2/1996 Bjornard et al. ........ 204/298.25
5,718,815 A   2/1998 Szczyrbowski et al. 204/298.06
6,168,698 B1 * 1/2001 Szczyrbowski et al. 204/298.25

FOREIGN PATENT DOCUMENTS

EP    0783174    7/1997
EP    1179516    2/2002

* cited by examiner

ELONGATE VACUUM SYSTEM FOR COATING ONE OR BOTH SIDES OF A FLAT SUBSTRATE

CROSS-REFERENCE TO RELATED APPLICATIONS

This is a section 371 filing of international application PCT/DE2004/002466 filed on Nov. 4, 2004 and published, in German, as international publication no. WO 2005/045092 A2 on May 19, 2005, which claims priority of German application no. 103 52 143.7 filed on Nov. 4, 2003, which applications are hereby incorporated by reference herein in their entirety.

BACKGROUND OF THE INVENTION

The invention relates to an elongate vacuum system for coating one or both sides of a flat substrate which can be moved through the vacuum system in a transportation plane by means of a transport system. The vacuum system comprises at least one magnetron provided with magnetron surrounding area and is subdivided into successive compartments in the direction of transportation of the substrate by closeable separating walls comprising suction openings, which can be evacuated either directly via a vacuum connection located on the compartment or indirectly via a suction opening in the separating wall. At least one compartment comprises an upper partial compartment which is located above the substrate, the said partial compartment comprising, in at least one of the outer walls thereof, a closeable upper opening.

A coating system which enables coating on both sides of a flat substrate during a single conveyance of the substrate through the system is described in EP 1 179 516 A1. The simultaneous arrangement of targets above and below the substrate moved through the system by means of a transport system enables simultaneous coating on both substrate surfaces within this section. At the same time, although the coating space is subdivided into several sections by barriers projecting into this, the coating process can nevertheless only be operated in the sections with the same or similar sputter atmosphere.

For the simultaneous operation of a coating system with process atmospheres deviating from one another considerably, the subdivision of the coating system into several sections to be evacuated separately as well the separation into coating and evacuation sections is universally known. Such a coating system is outlined in the European patent EP 783 174. It is essentially characterized by a large number of sections located next to one another in the direction of substrate transportation, which together form a vacuum chamber and are connected to one another via a passage, which forms the transportation plane for the flat substrate. Usually, adjoining coating sections each exhibiting a cathode are separated by at least one section capable of evacuation. The side separating walls between the evacuation and coating sections comprise suction openings via which the adjoining coating sections are evacuated indirectly by a connected vacuum pump.

When separating two adjoining coating sections by only one evacuation section, the vacuum pump located there consequently evacuates the, viewed in regard to the direction of transportation, previous and subsequent coating section. As a result of this, two gas flows. In opposite directions encounter each other in the evacuation section, which leads to turbulence and has a deleterious effect on the evacuation process and the performance values of the vacuum pump.

If the various coating sections are operated with different sputter atmospheres, further sections connected to the vacuum pump are necessary beside the evacuation section, which serve as pressure stages or for the gas separation. In this case, the coating system is elongated by the additionally required section, which leads to very longitudinally extended systems with large evacuation volumes when locating next to one another several different sputter atmospheres, sputter powers and/or cathode materials.

In a further development of the system, which is described in the patent specification DE 197 33 940, the evacuation sections are shortened in comparison to the coating sections and separated in the center by a transverse bulkhead arranged transverse to the direction of transportation, so that the vacuum pumps located in a series above the transverse bulkhead evacuate either the previous or the subsequent coating section by means of suitable recesses in the transverse bulkhead and corresponding to positioned baffle plates, depending on the adjustment of the baffle plate. This asymmetrical (as alternate) allocation of the pumps through the adjustment of the baffle plate leads to a pressure gradient and hence to deviations in the sputter conditions within the adjoining, indirectly evacuated coating section.

In this arrangement as well, a coating section usually follows an evacuation section, whereby both sections exhibit different dimensions. Correspondingly, an opening with different dimensions for each section type is incorporated in the upper wall of each section, which holds either a vacuum pump or a cover. A cathode removal with each cover including its cathode surroundings, comprising screens and media feed and extraction, can be mounted on each cover. At the same time, it proves to be very advantageous that the sequence of the sections cannot be changed on account of their different sizes for each coating system.

The cathode and its cathode environment is omitted in at least one coating section which is located between the coating sections to be separated and their adjoining evacuation sections in order to realize a gas separation for operating the system with different sputter conditions. In addition to this, the baffle plates are placed in the adjoining evacuation sections in such a way that both pumps evacuate the separation section located between this. As a result of this, and because, as described, only every second one of the next pumps series but one evacuates the coating sections coming before or after the gas separation, the pump power is significantly reduced in the coating sections located next to the gas separation, which leads to deviations in the sputter conditions between the sections.

BRIEF SUMMARY OF THE INVENTION

The invention therefore has the task of providing an elongate coating system which is to be designed flexibly for the requirements of different one and two-sided coating processes in respect to the process cycle through within the system and which thereby ensures a stable, differentiable and process-optimized sputter atmosphere.

The task is solved in the sense of the invention in such a way that at least horizontal and/or vertical elements can be mounted in one of the upper partial compartments for subdividing the upper partial compartments into several sections.

Corresponding to the present invention, the partial compartments exhibit no fixed conditioning for one of the possible functions as a coating, evacuation or gas separation section. Rather, the equipping of each partial compartment is enabled for one of these functions variably within a single system through the assembly or disassembly of the horizontal and vertical elements possible in particular via the closable, upper openings, without a cost and time-intensive complex conversion of the system.

The task underlying the invention in respect to the flexible design options of a vacuum system due to the horizontal and vertical elements described being capable of disassembly is meet to a particular degree, as the user himself can adapt not only the corresponding equipment and corresponding closure of the openings, but also a single system to his changing technological requirements through variable separation of sections.

At the same time, the sequence of the process sections following one another is almost freely selectable corresponding to the requirements of the planned coating result, without being fixed by circumstances associated with the system. In this way, in particular pump and gas separation sections can be added to a certain extent through variable subdivision of the partial compartments into, for example, two sections.

This variable subdivision is particularly advantageous as it satisfies the aspect of the stable, differentiable and process-optimized sputter atmosphere. In this way, for example, only one of the two adjoining sections is therefore evacuated by closing the suction openings of a separating wall. Amongst other things, a reduction in the suction power of the vacuum pump is prevented, which would otherwise result through the two gas flows encountering each other and swirling out of the partial compartments opposite one another. Differentiable process atmospheres and coating of specific sections within the compartment is also possible and can be maintained with stability, which corresponds to an essential aspect of the task in the sense of the present invention.

Corresponding to a particularly favorable embodiment of the invention, it is envisaged that at least a further lower compartment limited by the separating walls is located below the transportation plane, which in at least one of the outer walls exhibits a closable lower opening as well as a closable suction opening in each separating wall.

The flat substrate moved through the system separates the space above the transportation plane from the space below the transportation plane in each section, whereby the transportation plane is the plane in which the substrate is moved. For the purpose of coating the substrate on both sides, a coating space below the transportation plane can thereby be defined. Through the fact that both space sections resulting in this way—in particular if they also exhibit horizontal and/or vertical elements that can be mounted corresponding to a further design of the invention—are to be designed so as to be variable in a comparative way as the upper partial compartments, a stable, differentiable and process-optimized sputter atmosphere as well as variable coating parameters can be produced for the underside coating in the manner represented.

Consequently, either vacuum pumps can be connected to the lower partial compartments independently of the equipment of the upper partial compartment located above the substrate, or are equipped with at least one magnetron, whereby the space below the substrate of a section equipped in this way is useful for evacuation of the vacuum system or for underside and hence two-sided coating in a cycle through.

In the standard fitting, it proves to be very practical if the magnetrons including the magnetron surrounding area are mounted through the openings in the upper and/or lower outer walls, and the vacuum connections are located in the openings of the side outer walls. However, it is also possible to replace this assignment of the openings completely or for individual partial compartments, with the result that the magnetrons can be mounted on the sides of the vacuum system.

It proves to be especially advantageous if definite sections of the coating system, viewed from the aspect of the transportation direction, are fitted both above and below the transportation plane for a definite function or at least comparable functions, for example gas separation, whereby the lower partial compartment exhibits the same or at least a similar arrangement of the horizontal and/or vertical elements as the upper partial compartment opposite it above the transportation plane.

Through the fact that the upper and lower openings, irrespective of whether they are located in the upper or respectively the lower outer wall or in a side outer wall, can be closed with covers and at least one magnetron including the magnetron surrounding area can be mounted on a cover, and/or a vacuum connection is in place or a cover can only serve as a closure, it is possible to convert a single system for the most diverse coating configurations. This advantage is extended yet further if, corresponding to a further embodiment of the invention, the covers exhibit the same dimensions in respect to each other and can therefore by replaced by one another. In this way, it is easy to change the equipment of the individual partial compartments by replacing the covers.

A variable vacuum chamber of this type makes it possible, through the suitable arrangement of the vacuum connections, magnetrons and closing covers as well through the corresponding choice of coating parameters or separation of the sections of different coating conditions and through a suitable transport system, to realize a coating process with which the substrate underside can be coated at the same time as and independently of the substrate upper side.

The replaceability and the uniform size of the covers, however, does not necessarily require a uniform size of the openings themselves. Openings of various designs can also be closed with covers of the same dimensions through an effective embodiment not described in more detail here with adapters.

On the other hand, if the upper openings of all partial compartments exhibit the same dimensions, as is envisaged in a specially equipped version of the invention, the covers including the mounted components can be replaced with each other without further conversions, which further increases the variability of the coating system corresponding to the task of the invention.

In the same way, it remains free, in the sense of the high level of universality of the vacuum system corresponding to the invention, whether special covers are provided for the connection of one or more vacuum pumps, one or more magnetrons or only for closure of the opening, or whether a universal cover version enables all three application forms through corresponding add-ons or conversions.

Insofar as the width of the vacuum system and the size of the openings permit it, the arrangement of several vacuum pumps or their connections in the openings of the upper and lower outer walls is possible in a sequence vertical to the direction of transportation. Whether several connections located in a row are supported by several or by only one cover, depends on the size of the system and the spatial requirement necessary for the connections.

Another embodiment corresponding to the invention envisages that at least a side outer wall of an upper and/or lower partial compartment exhibits a vacuum pump. This enables a comparatively variable system, even if, for example, the constructional circumstances do not permit an equipping of the system with magnetrons or vacuum pump connections on the lower side of the system. In this case, the evacuation of the partial compartment or sections can be realized via the side vacuum pump connections and the underside coating can, for example, be realized via a magnetron suspended in a certain way from a cover of an upper opening below the substrate.

It is also possible to close the upper openings, corresponding to the constructional circumstances and the possible technological requirements. In particular, the free space in front of the respective outer wall available for operation and maintenance is considered as a constructional opportunity.

An especially advantageous embodiment envisages that the elements for the horizontal and for vertical subdivision of the partial compartment are even. This is because, in particular in this case, it is possible that at least one horizontal element is located on holding devices exhibiting a horizontal supporting surface, which are present on at last two opposite walls of the partial compartment, the side outer walls and/or the separating walls. Owing to the pressure ratios in the vacuum system, no special sealing systems are necessary for the subdivision of a partial compartment into sections in the sense of the present invention.

The usual technical fitting accuracies of the horizontal element to the surrounding walls and its loose location on the holders is sufficient for the effective subdivision in respect to the outlined possible functions of the sections in the case of coating parameters of the adjoining sections which do not deviate form one another too significantly. The fixing in this version is solely by the weight of the horizontal element.

It is easy to see that the conversion of the system for new specifications is very simple in this embodiment form and can be realized with the minimum of technical and time expense.

If, furthermore, at least one horizontal element exhibits, corresponding to further embodiments in the sense of the invention, a vertical element fastened by means of a joint or by means of an insertion device, which extends between the horizontal element and the upper or lower outer walls directly opposite the horizontal element, the vertical subdivision of a partial compartment equipped in this way can be realized particularly quickly and easily.

In a further advantageous embodiment of the invention, fixing elements are present on the cover which closes the upper or lower opening located in the upper or lower outer wall opposite the horizontal element. These fixing elements fix the vertical element in its position after closure of the opening. This is particularly advantageous for the described arrangement of the vertical element by means of a joint on the horizontal element, but also otherwise enables a situation whereby the subdivision of the partial compartment by the vertical element does not necessarily have to occur by means of complex sealing systems, a usual fitting accuracy possibly being sufficient. In this version, the vertical element is simply fastened by putting the cover on.

Corresponding to a further advantageous embodiment in the sense of the present invention, the location of a gas separation is envisaged, so that in at least one partial compartment a horizontal element is located in such a way that a section of the partial compartment is separated off towards the space surrounding the transportation plane.

The separation off of this space enables the positioning of a gas separation between two coating partial compartments operated with different sputter atmospheres, whereby the transportation plane connecting these two coating compartments is also evacuated. If the space surrounding the transportation plane is also separated off from the remaining partial compartment by a horizontal element in the lower partial compartment located below the transportation plane, a channel is created in the immediate environment of the substrate, which functions as a flow resistance and hence prevents a compensation of the atmospheres of the adjoining partial compartments.

Moreover, the separation off of the transportation space also enables divergent operation of the pump sections separated off in this way above and below the substrate. Owing to the variable connection options of the vacuum pumps and magnetrons, the latter enables a situation whereby the tasks can be assumed by two coating sections, located next to one another in conventionally comparable coating systems, of partial compartments positioned above each other within a compartment of the system corresponding to the invention, hence allowing the elongation of the system to be reduced.

In another embodiment corresponding to the invention, it proves to be particularly advantageous if the horizontal and/or vertical elements of at least one partial compartment have a closeable additional suction opening. This is always necessary in such configurations if a section is to be evacuated indirectly via the adjoining section or the transportation plane is separated off by a horizontal element and the section located under or above this serves as a gas separation.

A finely adjusted evacuation management is possible as an advantageous feature, if the size of the suction openings in the separating walls of the compartments and/or the additional suction openings in the horizontal and/or vertical elements are designed to be adjustable. If the suction openings are designed to be automatically adjustable in their size for example, the sputter parameters can also be optimized during the coating process in addition to the flexible conversion of the vacuum system in the sense of the invention.

BRIEF DESCRIPTION OF THE DRAWING FIGURES

The invention shall now be explained in more detail on the basis of an embodiment example. The associated drawing shows in FIG. 1 the schematic representation of a longitudinal section of a coating system corresponding to the invention and FIG. 2 a simplified longitudinal section of a section of the coating system corresponding to the invention.

DETAILED DESCRIPTION

The elongated vacuum system shown in FIG. 1 serves for the two-sided coating of a flat substrate 1 in the course of a cycle through the system. The vacuum system consists of four evacuation compartments 2 and three coating compartments 3, which are separated from one another by separating walls 4. The transportation of the substrate 1 through the coating system occurs in the transportation plane 5 by means of a transport system not represented, whereby the passages in and out of the coating system itself as well as from one compartment into the next one are realized via sluices 6 which are located in the separating walls 4 of the compartments.

In the present embodiment example, all the partial compartments in the upper outer walls 7 as well as the lower outer walls 8 exhibit upper and lower openings 10, 23, respectively, which can be closed tightly with covers 11 of a uniform size. The evacuation compartments 3 also contain vacuum connections 16 in the covers 11a closing the openings in the side outer walls 9, whereby in the present embodiment example these side covers 11a exhibit a different side geometry to the cover 11 of the openings in the upper outer walls 7 and lower outer walls 8. Moreover, two suction openings 12 are also located in each separating wall 4 above and below the transportation plane 5 respectively. These suction openings 12 are arranged in sequence and parallel to the substrate 1 as well as perpendicularly to the direction of transportation 13 and can be closed tightly with a closure 14.

The first coating compartment 3a, from the point of view of the direction of transportation 13, comprises a magnetron 15 including the magnetron surrounding area not shown, which is located above the substrate 1 (sputter-down position) and is mounted on the cover 11, which closes the upper opening 10 in the upper outer wall. The first coating section 3a is indirectly evacuated by vacuum pumps 16 which are connected in the two adjoining evacuation compartments 2 on the covers 11a closing the openings in the side outer walls 9 above the transportation plane 5. In the system configuration shown, the suction openings 12 in the separating walls 4 of this first coating compartment 3a are completely opened for this purpose above the transportation plane 5 and tightly closed below the transportation plane 5.

In the second coating compartment 3b, a magnetron 15, also including the magnetron surrounding area not shown here, is mounted on the upper cover in such a way that a sputter-up operation is possible. For this purpose, the magnetron 15 is positioned opposite the underside of the substrate 1 and the suction openings 12 located in this area of the second coating compartment 3b are opened for indirect evacuation by means of the vacuum pumps 16 connected to the two adjoining evacuation compartments 2. In the second coating compartment 3b, the suction openings 12 above the transportation plane 5 are closed off tightly with seals 14.

The third coating compartment 3c, on the other hand, exhibits the same configuration as the second 3b. However, the sputter atmospheres under which the second and third coating compartments 3b, 3c are operated differ from one another. In order to prevent a reciprocal contamination, a gas separation is provided between them. For this purpose, the transportation plane 5 is separated off from the evacuation compartment 2 by two horizontal elements 17 arranged parallel to the substrate 1 above and below the transportation plane 5. While the lower horizontal element 17 tightly closes the partial compartment 19 located below it towards the transportation plane 5, the upper horizontal element 17 exhibits four suction openings 12 arranged n two rows, via which the separated transportation level 5 can be evacuated by means of vacuum pumps 16 connected to a side cover 11a of the upper partial compartment 18. The suction openings 12 leading into the adjoining coating compartments 3b, 3c in the separating walls 4 of the upper partial compartment 18 are tightly closed owing to the function of the upper partial compartment 18 as a gas separation.

The evacuation of the adjoining, second and third, coating compartments 3b and 3c is via the same evacuation compartment 2 as the gas separation. A further element running vertical 20 and parallel to the separating walls is positioned for this in the lower partial compartment 19, which subdivides the lower partial compartment 19 into two sections 21. Each of the openings located in the side outer walls 9 extends over both sections 21 and the covers 11a closing these lower openings 23 exhibit two vacuum pump connections 16 respectively, on in each section 21.

A further evacuation compartment 2 forms the connection of the said vacuum system, on whose cover 11a of the side lower openings 23 vacuum pump connections 16 are mounted. In the embodiment example described, the vacuum pumps 16 are always connected to the side outer walls 9 at the vacuum pump connections and the lower openings 23 in the lower outer walls 8 are only closed with covers 11 which support no further components. Likewise, it is also possible, however, to mount all or individually selected vacuum pump connections 16 or the vacuum pumps 16 themselves onto the covers 11 of the lower or upper openings 23, 10. Nevertheless, it is the special system configurations as well as the maintenance and assembly space availability which always determine onto which covers 11, 11a vacuum pump connections 16 and magnetrons 15 are mounted.

Figure 2:
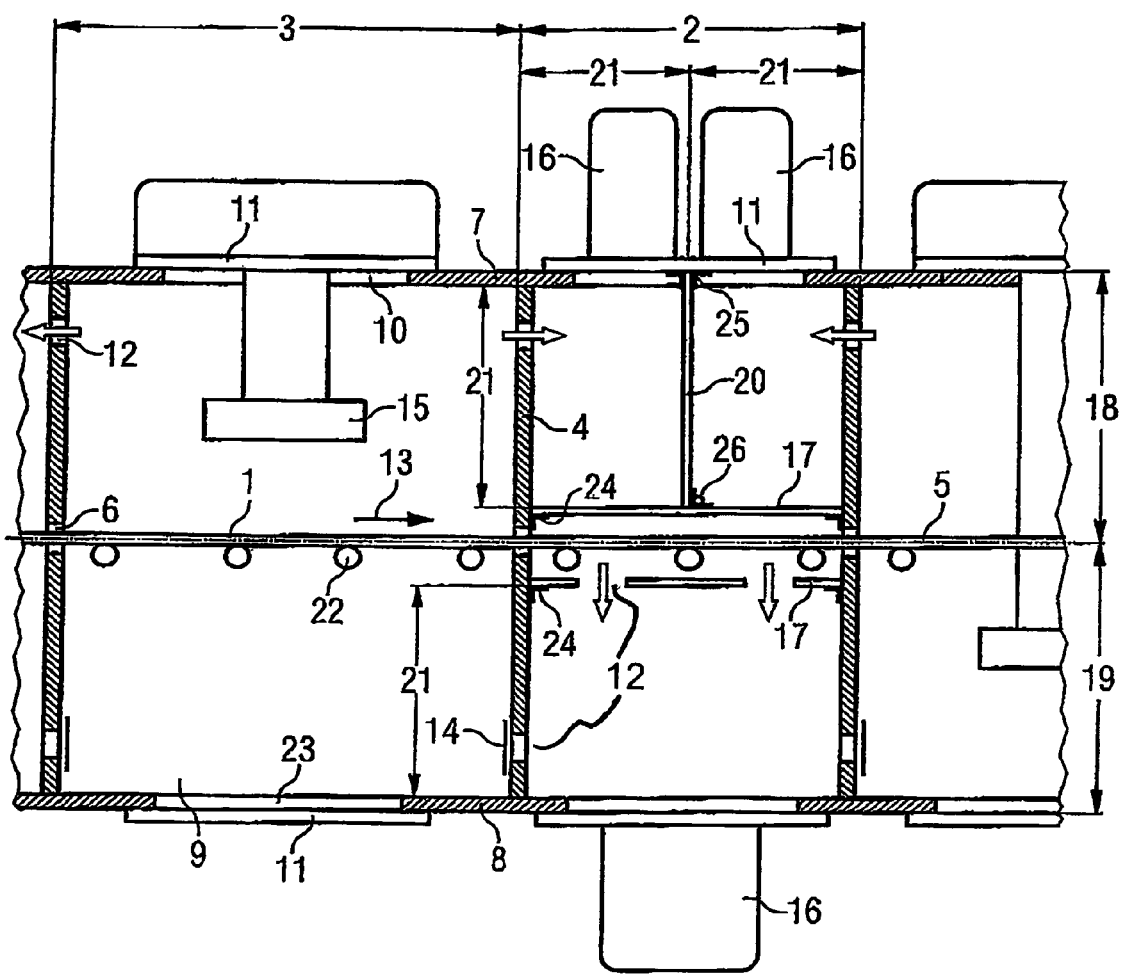

FIG. 2 therefore shows a section comprising the gas separation and an adjoining coating compartment 3 with a magnetron 15 in a sputter-down position of a vacuum pump system corresponding to the invention with a substrate 1 moved through the system on transport rollers 22. In this embodiment variant, the magnetrons 15 are only introduced through the upper openings 10 in the upper outer walls 7 of the system and the vacuum pumps 16 are (exclusively also) mounted directly on the covers 11, which close the upper and lower opening 10, 23 in the upper outer walls 7 or lower outer walls 8. In order to adjust the pump power of this design embodiment to that according to FIG. 1, where to (in each side outer wall 9 one) vacuum pumps 16 are connected, two vacuum pumps 16 each are located in a row of pumps perpendicular to the direction of transportation 13, which is not discernible in the selected figure as a result of the pumps arranged one after the other in the direction of view. Corresponding to the arrangement of the gas separation in the lower partial compartment 19, the suction openings 12 in this embodiment variant, which lead to the adjoining coating compartments 3, are tightly closed in this section 21 with seals 14.

The even, horizontal elements 17 are located on angular shaped holders 24, which are situated on the separating walls 4. A vertical element 20 is attached onto the horizontal element 17 in the upper partial compartment 18 approximately in the center by means of a joint 26, which is fasted onto the upper cover 11 in its vertical position by means of the fixing elements 25. The horizontal element 17 in the lower partial compartment 19 exhibits two suction openings 12 though which the transportation plane 5 can be evacuated.

Elongate Vacuum System for Coating One or Both Sides of a Flat Substrate

Reference Sign List

1 Substrate
2 Evacuation compartments
3 Coating compartments
3a,b,c First, second, third coating compartment
4 Separating wall
5 Transportation plane
6 Sluices
7 Upper outer wall
8 Lower outer Wall
9 Side outer wall
10 Upper opening
11 Cover
11a Side cover
12 Suction opening
13 Direction of transportation
14 Closure
15 Magnetron
16 Vacuum pump or vacuum connection
17 Horizontal element
18 Upper partial compartment
19 Lower partial compartment
20 Vertical element
21 Section
22 Transport rollers
23 Lower opening 24 Holders
25 Fixing elements
26 Joint

The invention claimed is:

1. Elongate vacuum system for coating one or both sides of a flat substrate which can be moved through the vacuum system in a transportation plane by means of a transport system, wherein the vacuum system comprises at least one magnetron with magnetron surrounding area and is subdivided into successive compartments in a direction of transportation of the substrate by separating walls having closeable suction openings, which compartments can be evacuated either directly via a vacuum connection located on a compartment or indirectly via a suction opening in a separating wall, wherein at least one compartment comprises an upper partial compartment which is located above the substrate, said partial compartment comprising, in at least one of outer walls thereof, a closeable upper opening, and wherein horizontal and/or vertical elements are mountable in the upper partial compartments for subdivision of the upper partial compartment into several sections.

2. Elongate vacuum system according to claim 1, wherein at least a further lower compartment limited by the separating walls is located below the transportation plane, said lower compartment having a closable lower opening in one of the outer walls as well as a closeable suction opening in each separating wall.

3. Elongate vacuum system according to claim 2, wherein horizontal and/or vertical elements are mountable in the lower partial compartment for subdivision of the lower partial compartment into several sections.

4. Elongate vacuum system according to claim 3, wherein the lower partial compartment exhibits a structure reflected around the transportation plane of the upper compartment opposite the lower partial compartment, above the transportation plane.

5. Elongate vacuum system according to claim 2, wherein the upper and lower openings can be closed with covers and at least one magnetron is mounted on a cover of said covers and/or a vacuum connection is present.

6. Elongate vacuum system according to claim 5, wherein the covers exhibit the same dimensions to one another.

7. Elongate vacuum system according to claim 2, wherein the upper and lower openings of all partial compartments exhibit the same dimensions.

8. Elongate vacuum system according to claim 2, wherein at least one of the upper or lower openings in a side outer wall of an upper and/or lower partial compartment comprises a vacuum connection.

9. Elongate vacuum system according to claim 3, wherein the horizontal and/or vertical elements for subdivision of the upper and lower partial compartments are even.

10. Elongate vacuum system according to claim 3, wherein at least one horizontal element of a partial compartment can be placed on holders having a horizontal supporting surface, which holders are present on at least two opposite walls of the partial compartment.

11. Elongate vacuum system according to claim 3, wherein a vertical element is fastened on at least one horizontal element by means of a joint and the vertical element extends between the horizontal element and the upper or lower outer walls directly opposite the horizontal element.

12. Elongate vacuum system according to claim 3, wherein at least one horizontal element has an insertion device for holding a vertical element and the vertical element extends between the horizontal element and the upper or lower outer walls directly opposite the horizontal element.

13. Elongate vacuum system according to claim 11, wherein fixing elements are present on a cover which closes the upper or lower opening located in the upper or lower outer wall opposite the horizontal element, which fixing elements fix the vertical element in position after closure of the upper or lower opening.

14. Elongate vacuum system according to claim 3, wherein in at least one upper and/or lower respective partial compartment a horizontal element is located in such a way that a section of the respective partial compartment is separated off from a space surrounding the transportation plane.

15. Elongate vacuum system according to claim 3, wherein the horizontal and/or vertical elements of at least one partial compartment have a closeable additional suction opening.

16. Elongate vacuum system according to claim 15, wherein size of the suction openings in the separating walls of the upper and/or lower partial compartments and/or of the additional suction openings in the horizontal and/or vertical elements is adjustable.

* * * * *